(12) United States Patent
Saito et al.

(10) Patent No.: US 7,728,354 B2
(45) Date of Patent: Jun. 1, 2010

(54) SEMICONDUCTOR DEVICE

(75) Inventors: Wataru Saito, Kanagawa-ken (JP);
Akira Yoshioka, Kanagawa-ken (JP);
Hidetoshi Fujimoto, Kanagawa-ken (JP); Takao Noda, Kanagawa-ken (JP);
Yasunobu Saito, Tokyo (JP); Tomohiro Nitta, Kanagawa-ken (JP); Yorito Kakiuchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 11/939,976

(22) Filed: Nov. 14, 2007

(65) Prior Publication Data
US 2008/0116486 A1     May 22, 2008

(30) Foreign Application Priority Data
Nov. 17, 2006 (JP) .............. 2006-311450

(51) Int. Cl.
*H01L 21/338* (2006.01)
(52) U.S. Cl. .............. 257/192; 257/E29.242
(58) Field of Classification Search ........... 257/192, 257/E29.242
See application file for complete search history.

(56) References Cited

U.S. PATENT DOCUMENTS

| 6,100,549 | A  | * | 8/2000 | Weitzel et al. ........... 257/194 |
| 6,555,851 | B2 |   | 4/2003 | Morizuka |
| 6,689,652 | B2 |   | 2/2004 | Morizuka |
| 6,908,799 | B2 |   | 6/2005 | Morizuka |
| 7,075,125 | B2 | * | 7/2006 | Saito et al. ............ 257/194 |
| 7,157,748 | B2 |   | 1/2007 | Saito et al. |
| 2007/0037308 | A1 | * | 2/2007 | Okuyama et al. .......... 438/46 |

FOREIGN PATENT DOCUMENTS

JP    2003-347315    12/2003

OTHER PUBLICATIONS

Masayuki Kuroda et al., "Normally-Off Operation of Non-polar AlGaN/GaN Heterojunction FETs Grown on R-Plane Sapphire", Extended Abstracts of the 2005 International Conference on Solid State Devices and Materials, Kobe, 2005, pp. 740-741.*
Masayuki Kuroda, et al., "Normally-off Operation of Non-polar AlGaN/GaN Heterojunction FETs Grown on R-plane Sapphire", Extended Abstracts of the 2005 International Conference on Solid State Devices and Materials, Kobe, Sep. 2005, pp. 470-471.

* cited by examiner

*Primary Examiner*—Zandra Smith
*Assistant Examiner*—Jamie Niesz
(74) *Attorney, Agent, or Firm*—Oblon, Spivak, McClelland, Maier & Neustadt, L.L.P.

(57) ABSTRACT

A semiconductor device includes: a first semiconductor layer of p-type $Al_xGa_{1-x}N$ ($0 \leq x \leq 1$); a second semiconductor layer of n-type $Al_yGa_{1-y}N$ ($0<y<1$, $x<y$) formed on the first semiconductor layer; a control electrode formed on the second semiconductor layer; a first main electrode connected to the first semiconductor layer and the second semiconductor layer; and a second main electrode connected to the second semiconductor layer. An interface between the first semiconductor layer and the second semiconductor layer has a surface orientation of (1-101) or (11-20).

17 Claims, 11 Drawing Sheets

FIG. 1

$L_{d>a}$: DONOR ION CONCENTRATION IS HIGHER THAN ACCEPTOR ION CONCENTRATION $L_{a>d}$: ACCEPTOR ION CONCENTRATION IS HIGHER THAN DONOR ION CONCENTRATION $L_{a=d}$: ACCEPTOR ION CONCENTRATION IS EQUAL TO DONOR ION CONCENTRATION

SEMICONDUCTOR DEVICE

CROSS-REFERENCE TO RELATED APPLICATIONS

This application is based upon and claims the benefit of priority from the prior Japanese Patent Application No. 2006-311450, filed on Nov. 17, 2006; the entire contents of which are incorporated herein by reference.

BACKGROUND OF THE INVENTION

1. Field of the Invention

This invention relates to a semiconductor device, and more particularly to a semiconductor device based on a nitride semiconductor.

2. Background Art

A nitride semiconductor device based on a gallium nitride (GaN) semiconductor has a larger bandgap than devices based on silicon (Si), and hence it is easier to realize a compact device with high critical electric field and high breakdown voltage. Its application to a power control semiconductor device can lead to a device with low ON resistance and low loss. Among nitride semiconductor devices, a heterostructure field-effect transistor (HFET) having an AlGaN/GaN heterostructure is promising for good characteristics with a simple device structure, where a GaN layer is provided as a channel layer and an aluminum gallium nitride (AlGaN) layer is provided as a barrier layer (electron supply layer).

In conventional GaN-based HFETs, the heterojunction interface between the GaN layer and the AlGaN layer is the (0001) crystal plane. Thus a two-dimensional electron gas (2DEG) at approximately $1 \times 10^{13}$ cm$^{-2}$ is generated at the AlGaN/GaN heterointerface by piezoelectric polarization. This polarization-induced 2DEG accounts for a large share of the 2DEG existing at the heterointerface. In such a semiconductor device where a 2DEG is generated by piezoelectric polarization, advantageously, carriers are generated without implantation of impurities. However, unfortunately, because piezoelectric polarization determines the sheet concentration of the 2DEG, the sheet concentration of the 2DEG varies with the surface potential of the AlGaN layer depending on the passivation material and process, and consequently the ON resistance varies.

Thus it is contemplated to prevent a polarization-induced 2DEG from being generated at the heterointerface. Prevention of polarization-induced 2DEG generation can be realized by setting the surface orientation of the crystal plane forming the AlGaN/GaN heterostructure to (1-101) or (11-20) (see, e.g., Masayuki Kuroda et al., "Normally-off Operation of Non-polar AlGaN/GaN Heterojunction FETs Grown on R-plane Sapphire", Extended Abstracts of the 2005 International Conference on Solid State Devices and Materials, Kobe, 2005, pp. 470-471; and JP-A 2003-347315 (Kokai)). In this case, the GaN layer serving as a channel layer or the AlGaN layer serving as a barrier layer needs to be doped with n-type impurities for generating a 2DEG to serve as carriers. For achieving 2DEG sheet concentration comparable to that induced by polarization, the sheet concentration of n-type impurities needs to be approximately $1 \times 10^{13}$ cm$^{-2}$. However, if the sheet impurity concentration in the channel layer or the barrier layer is increased like this, the electric field distribution is varied by impurity ions, and the electric field concentrates on the edge of the gate electrode, unfortunately failing to achieve high breakdown voltage.

SUMMARY OF THE INVENTION

According to an aspect of the invention, there is provided a semiconductor device including: a first semiconductor layer of p-type AlxGa1-xN (0≦x<1); a second semiconductor layer of n-type AlyGa1-yN (0<y<1, x<y) formed on the first semiconductor layer; a control electrode formed on the second semiconductor layer; a first main electrode connected to the first semiconductor layer and the second semiconductor layer; and a second main electrode connected to the second semiconductor layer, an interface between the first semiconductor layer and the second semiconductor layer having a surface orientation of (1-101) or (11-20).

According to another aspect of the invention, there is provided a semiconductor device including: a first semiconductor layer of p-type AlxGa1-xN (0≦x<1); a third semiconductor layer of n-type AlzGa1-zN (0≦z<1, z≦x) formed on the first semiconductor layer; a fourth semiconductor layer of n-type or undoped AlyGa1-yN (0<y<1, z<y) formed on the third semiconductor layer; a control electrode formed on the fourth semiconductor layer; a first main electrode connected to the first semiconductor layer, the third semiconductor layer, and the fourth semiconductor layer; and a second main electrode connected to the fourth semiconductor layer, an interface between the third semiconductor layer and the fourth semiconductor layer having a surface orientation of (1-101) or (11-20).

According to more another aspect of the invention, there is provided a semiconductor device including: a first semiconductor layer of p-type AlxGa1-xN (0≦x<1); a third semiconductor layer of n-type InGaN formed on the first semiconductor layer; a fourth semiconductor layer of n-type or undoped AlyGa1-yN (0<y<1) formed on the third semiconductor layer; a control electrode formed on the fourth semiconductor layer; a first main electrode connected to the first semiconductor layer, the third semiconductor layer, and the fourth semiconductor layer; and a second main electrode connected to the fourth semiconductor layer, an interface between the third semiconductor layer and the fourth semiconductor layer having a surface orientation of (1-101) or (11-20).

DETAILED DESCRIPTION OF THE INVENTION

Embodiments of the invention will now be described with reference to the drawings. Like elements in the drawings are marked with like reference numerals.

First Embodiment

Figure 1:
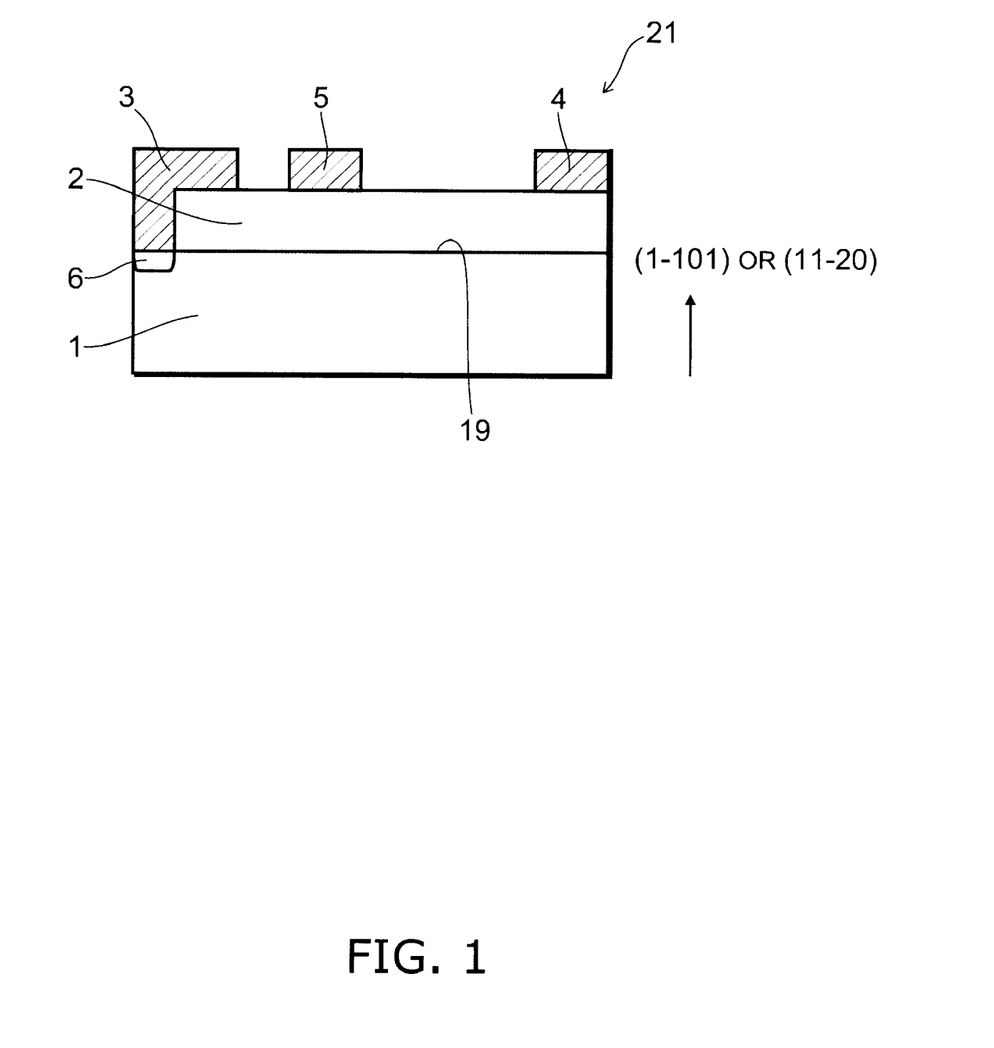
FIG. 1 is a cross-sectional view schematically illustrating a GaN-HFET according to a first embodiment of the invention.

FIG. 1 is a cross-sectional view schematically illustrating a GaN-HFET according to a first embodiment of the invention.

As shown in FIG. 1, in the GaN-HFET 21 according to this embodiment, a p-GaN channel layer 1 is formed as a first semiconductor layer on a support substrate (not shown). The p-GaN channel layer 1 is made of gallium nitride (GaN) or aluminum gallium nitride (AlGaN) doped with p-type impurities, and its composition can be expressed as $Al_xGa_{1-x}N$ where $0 \leq x < 1$. In the following, a layer having p-type conductivity is denoted by "p-", a layer having n-type conductivity is denoted by "n-", and a layer that is substantially not doped with impurities is denoted by "undoped".

An n-AlGaN barrier layer 2 is formed as a second semiconductor layer on the p-GaN channel layer 1. The n-AlGaN barrier layer 2 is made of n-type aluminum gallium nitride, and its composition can be expressed as $Al_yGa_{1-y}N$ where $0 < y < 1$ and $x < y$.

The p-GaN channel layer 1 and the n-AlGaN barrier layer 2 are formed by epitaxial growth, and the crystal growth plane thereof is the (1-101) or (11-20) plane. Hence the p-GaN channel layer 1 and the n-AlGaN barrier layer 2 form a heterointerface 19. The surface orientation of this heterointerface 19 is (1-101) or (11-20). The sheet impurity concentration in the p-GaN channel layer 1 is preferably higher than or equal to the sheet impurity concentration in the n-AlGaN barrier layer 2, and preferably lower than or equal to twice the sheet impurity concentration in the n-AlGaN barrier layer 2.

On the n-AlGaN barrier layer 2, a source electrode 3 (first main electrode), a drain electrode 4 (second main electrode), and a gate electrode 5 (control electrode) are provided, spaced from each other. That is, the GaN-HFET 21 according to this embodiment is a lateral power device. Part of the source electrode 3 penetrates the n-AlGaN barrier layer 2 and is in contact with the p-GaN channel layer 1. A $p^+$-contact layer 6 is formed in the region of the p-GaN channel layer 1 in contact with the source electrode 3. The p-type impurity concentration in the $p^+$-contact layer 6 is higher than the p-type impurity concentration in the p-GaN channel layer 1. Thus the source electrode 3 is connected to both the p-GaN channel layer 1 and the n-AlGaN barrier layer 2, and is in ohmic contact with the two-dimensional electron gas (2DEG) generated near the interface 19 of the p-GaN channel layer 1. The drain electrode 4 is connected to the n-AlGaN barrier layer 2, and in ohmic contact with the 2DEG through the n-AlGaN barrier layer 2. Furthermore, the gate electrode 5 is placed between the source electrode 3 and the drain electrode 4, and forms a Schottky junction with the n-AlGaN barrier layer 2.

Next, the operation of this embodiment is described.

Figure 2:
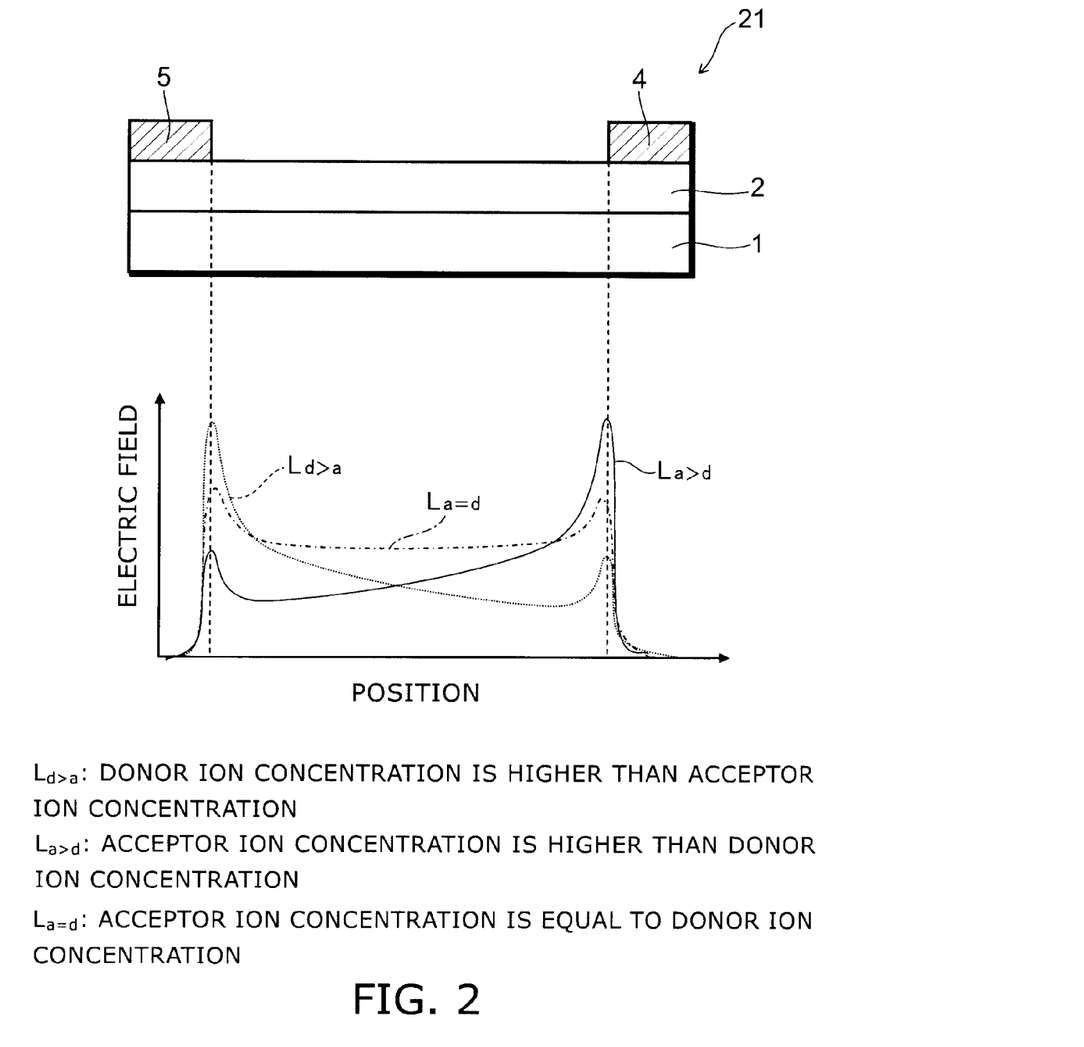
FIG. 2 is a cross-sectional view illustrating gate-drain region of the GaN-HFET according to the first embodiment, and a graph illustrating electric field distribution in the GaN-HFET where the horizontal axis represents position in the GaN-HFET and the vertical axis represents electric field strength at the position.

FIG. 2 shows a cross-sectional view illustrating the gate-drain region of the GaN-HFET according to this embodiment, and a graph illustrating the electric field distribution in the GaN-HFET where the horizontal axis represents position in the GaN-HFET and the vertical axis represents electric field strength at the position.

In this embodiment, the surface orientation of the crystal plane of the AlGaN/GaN heterointerface 19 is (1-101) or (11-20). Hence the 2DEG due to piezoelectric or spontaneous polarization is not generated near the interface 19 of the p-GaN channel layer 1. Instead, n-type impurities implanted into the n-AlGaN barrier layer 2 generate a 2DEG. The sheet concentration of the 2DEG is determined by the sheet impurity concentration in the n-AlGaN barrier layer 2. Hence, as compared with the case of generating a 2DEG by piezoelectric polarization, the surface potential of the n-AlGaN barrier layer 2 does not cause the variation of the 2DEG sheet concentration, stabilizing the ON resistance.

Here, donor ions exist in the n-AlGaN barrier layer 2. Hence the n-AlGaN barrier layer 2 is charged positive and generates an electric field. However, in this embodiment, the p-GaN channel layer 1 is doped with p-type impurities and contains acceptor ions. Hence the p-GaN channel layer 1 is charged negative. Thus the electric field generated by the donor ions in the n-AlGaN barrier layer 2 can be canceled by the acceptor ions in the p-GaN channel layer 1. Hence high breakdown voltage can be achieved. Furthermore, when a negative potential is applied to the gate electrode 5, a depletion layer extends from the gate electrode 5 toward the drain electrode 4. Here, a depletion layer extends also from the heterointerface 19 between the p-GaN channel layer 1 and the n-AlGaN barrier layer 2 and reduces channel leak current. Hence an even higher voltage can be held.

The gradient of the electric field distribution during application of high voltage is determined by the magnitude of charge of the impurity ions in the depletion layer. More specifically, if the donor ion concentration in the n-AlGaN barrier layer 2 is higher than the acceptor ion concentration in the p-GaN channel layer 1, the electric field on the gate electrode 5 side increases as shown by line $L_{d>a}$ in FIG. 2. On the other hand, if the acceptor ion concentration in the p-GaN channel layer 1 is higher than the donor ion concentration in the n-AlGaN barrier layer 2, the electric field on the drain electrode 4 side increases as shown by line $L_{a>d}$ in FIG. 2. If the acceptor ion concentration equals the donor ion concentration, a flat electric field distribution can be obtained as shown by line $L_{a=d}$ in FIG. 2.

The gate electrode 5 forms a Schottky junction with the n-AlGaN barrier layer 2. Hence, upon application of high electric field, a leak current flows through the n-AlGaN barrier layer 2 by the tunnel effect. Thus breakdown occurs at a lower voltage than avalanche breakdown occurring on the drain side. Furthermore, because carriers are not released from the gate electrode 5, the current is more likely to be amplified. Hence, for stably achieving high breakdown voltage, it is preferable to design the device so that the breakdown voltage is determined by the avalanche breakdown in the semiconductor layer. That is, the acceptor ion concentration in the p-GaN channel layer 1 is preferably higher than the donor ion concentration in the n-AlGaN barrier layer 2 (line $L_{a>d}$) so that the electric field is higher on the drain electrode 4 side than on the gate electrode 5 side. Hence, in the GaN- HFET 21 according to this embodiment, the sheet impurity concentration in the p-GaN channel layer 1 is preferably higher than the sheet impurity concentration in the n-AlGaN barrier layer 2. It is noted that the "sheet impurity concentration" used herein refers to the sheet concentration of activated impurities.

On the other hand, if the sheet impurity concentration (acceptor ion concentration) in the p-GaN channel layer 1 is too high, the electric field excessively increases at the edge of the drain electrode 4, contrarily decreasing the breakdown voltage. The electric field distribution between the gate electrode 5 and the drain electrode 4 is determined by the difference between the sheet impurity concentration in the n-AlGaN barrier layer 2 and the sheet impurity concentration in the p-GaN channel layer 1. If the sheet impurity concentration in the p-GaN channel layer 1 is higher than twice the sheet impurity concentration in the n-AlGaN barrier layer 2, the breakdown voltage is lower than that in the case without interposition of the p-GaN channel layer 1. Hence, more preferably, the sheet impurity concentration in the p-GaN channel layer 1 is lower than or equal to twice the sheet impurity concentration in the n-AlGaN barrier layer 2. Therefore the sheet impurity concentration in the p-GaN channel layer 1 is preferably 1 to 2 times the sheet impurity concentration in the n-AlGaN barrier layer 2.

In this embodiment, the p-GaN channel layer 1 is connected to the source electrode 3 through the p$^+$-contact layer 6. Hence holes in the p-GaN channel layer 1 can be rapidly charged and discharged. Thus the switching rate can be improved.

Next, the effect of this embodiment is described.

As described above, according to this embodiment, the surface orientation of the heterointerface 19 between the p-GaN channel layer 1 and the n-AlGaN barrier layer 2 is set to (1-101) or (11-20). Thus polarization-induced 2DEG generation is prevented, and a 2DEG is generated by n-type impurities (donors) with which the n-AlGaN barrier layer 2 is doped. Hence the ON resistance can be stabilized. Furthermore, the p-GaN channel layer 1 is doped with p-type impurities (acceptors). Thus the electric field generated by donor ions is canceled by acceptor ions, and depletion is facilitated. Hence the breakdown voltage can be improved. Moreover, the switching rate can be improved by connecting the p-GaN channel layer 1 to the source electrode 3.

Next, a variation of the first embodiment is described.

Figure 3:
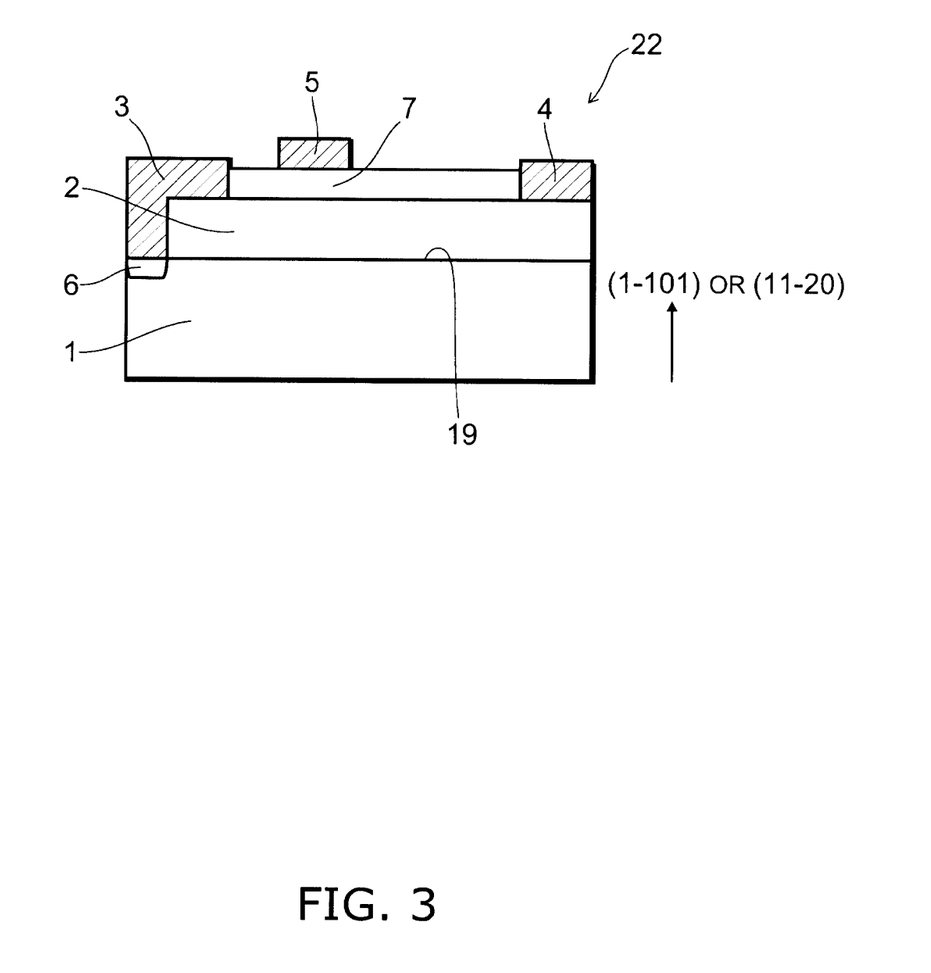
FIG. 3 is a cross-sectional view schematically illustrating a GaN-HFET according to a variation of the first embodiment.

FIG. 3 is a cross-sectional view schematically illustrating a GaN-HFET according to this variation.

As shown in FIG. 3, in the GaN-HFET 22 according to this variation, a gate insulating film 7 is provided between the n-AlGaN barrier layer 2 and the gate electrode 5. Thus the tunnel leak current flowing from the gate electrode 5 to the n-AlGaN barrier layer 2 can be restrained. Furthermore, by increasing the sheet impurity concentration in the p-GaN channel layer 1, the electric field strength near the gate electrode 5 can be reduced, and the electric field strength in the gate insulating film 7 can be also reduced. Thus the reliability of the gate insulating film 7 can be improved. The configuration, operation, and effect in this variation other than the foregoing are the same as those in the first embodiment described above.

Second Embodiment

Figure 4:
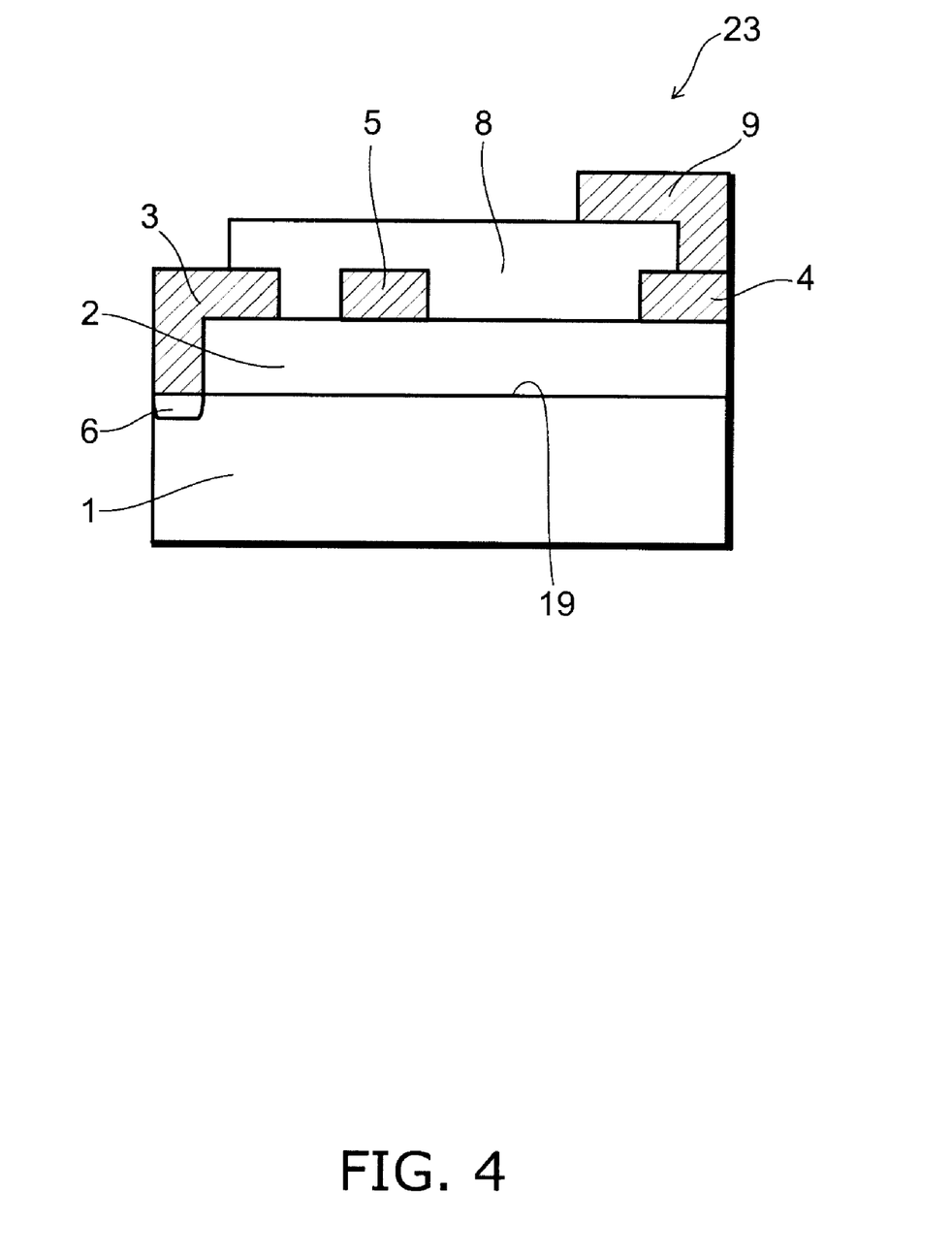
FIG. 4 is a cross-sectional view schematically illustrating a GaN-HFET according to a second embodiment of the invention.

FIG. 4 is a cross-sectional view schematically illustrating a GaN-HFET according to a second embodiment of the invention. In FIG. 4, the same elements as those in FIG. 1 are marked with like reference numerals, the detailed description thereof being omitted, and only different elements are described here in detail.

As shown in FIG. 4, in the GaN-HFET 23 according to this embodiment, in addition to the configuration of the GaN-HFET 21 according to the first embodiment described above, a field insulating film 8 is provided on the n-AlGaN barrier layer 2. The field insulating film 8 covers the surface of the n-AlGaN barrier layer 2, and also covers the source electrode 3, the drain electrode 4, and the gate electrode 5. On the field insulating film 8 is provided a field plate electrode 9 connected to the drain electrode 4. On the field insulating film 8, the field plate electrode 9 extends out from the directly overlying region of the drain electrode 4 toward the gate electrode 5.

Also in this embodiment, as described above in the first embodiment, the sheet impurity concentration in the p-GaN channel layer 1 is made higher than the sheet impurity concentration in the n-AlGaN barrier layer 2 to prevent avalanche breakdown from occurring near the gate electrode 5. On the other hand, however, electric field is likely to concentrate on the edge of the drain electrode 4, and the breakdown voltage may decrease. Hence, in this embodiment, the field plate electrode 9 is formed to prevent electric field concentration on the edge of the drain electrode 4 as well. Thus high breakdown voltage can be achieved more stably. The configuration, operation, and effect in this embodiment other than the foregoing are the same as those in the first embodiment described above.

Next, a first variation of the second embodiment is described.

Figure 5:
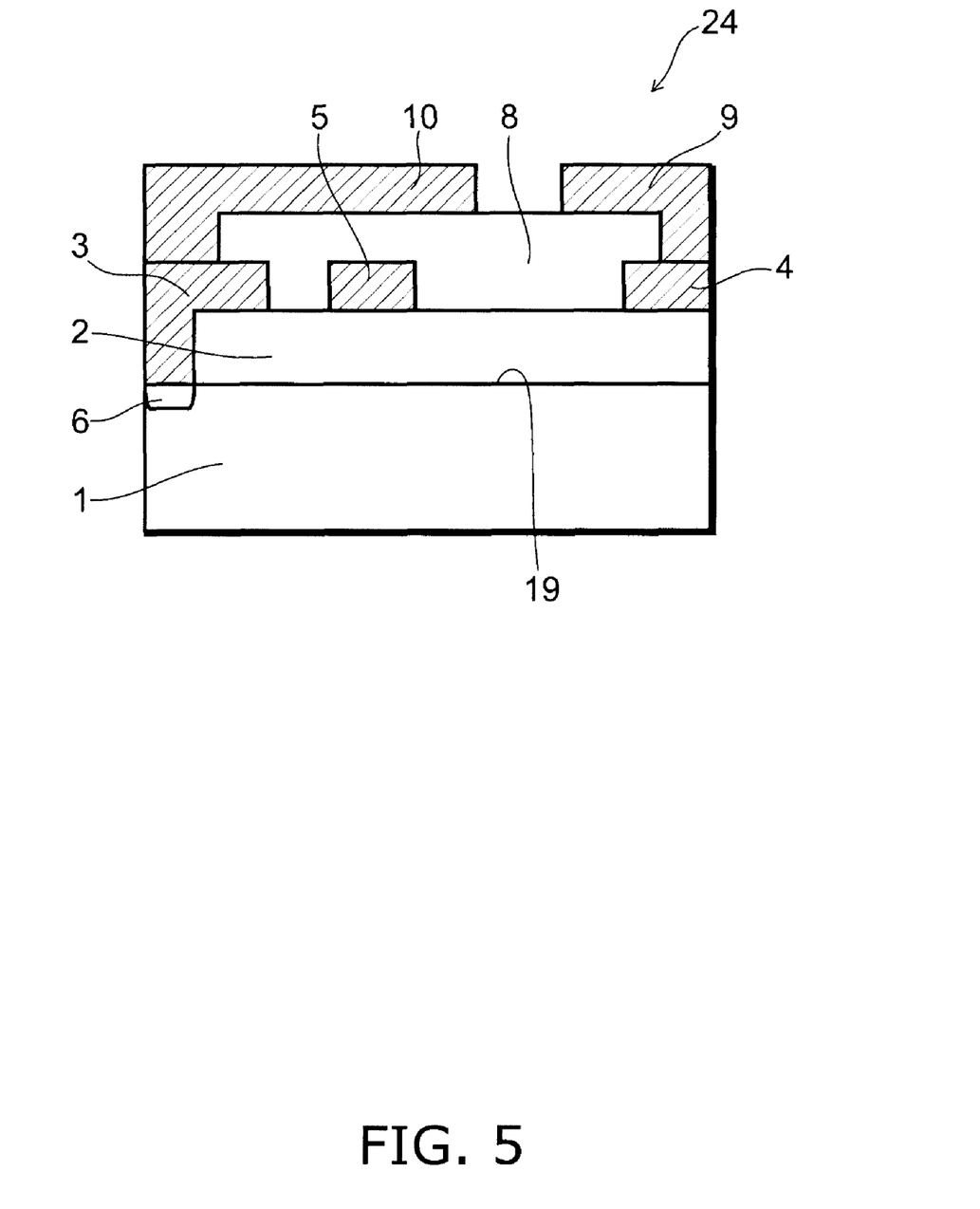
FIG. 5 is a cross-sectional view schematically illustrating a GaN-HFET according to a first variation of the second embodiment.

FIG. 5 is a cross-sectional view schematically illustrating a GaN-HFET according to this variation.

As shown in FIG. 5, in the GaN-HFET 24 according to this variation, in addition to the configuration of the GaN-HFET 23 according to the second embodiment described above, a second field plate electrode 10 connected to the source electrode 3 is provided on the field insulating film 8. The field plate electrode 10 is formed in the same layer as the field plate electrode 9 and, on the field insulating film 8, extends out from the directly overlying region of the source electrode 3 so as to cover the directly overlying region of the gate electrode 5.

According to this variation, the second field plate electrode 10 serves to prevent electric field concentration on the edge of the gate electrode 5 more effectively, achieving a higher breakdown voltage. It is noted that the second field plate electrode 10 may be connected to the gate electrode 5. The configuration, operation, and effect in this variation other than the foregoing are the same as those in the second embodiment described above.

Next, a second variation of the second embodiment is described.

Figure 6:
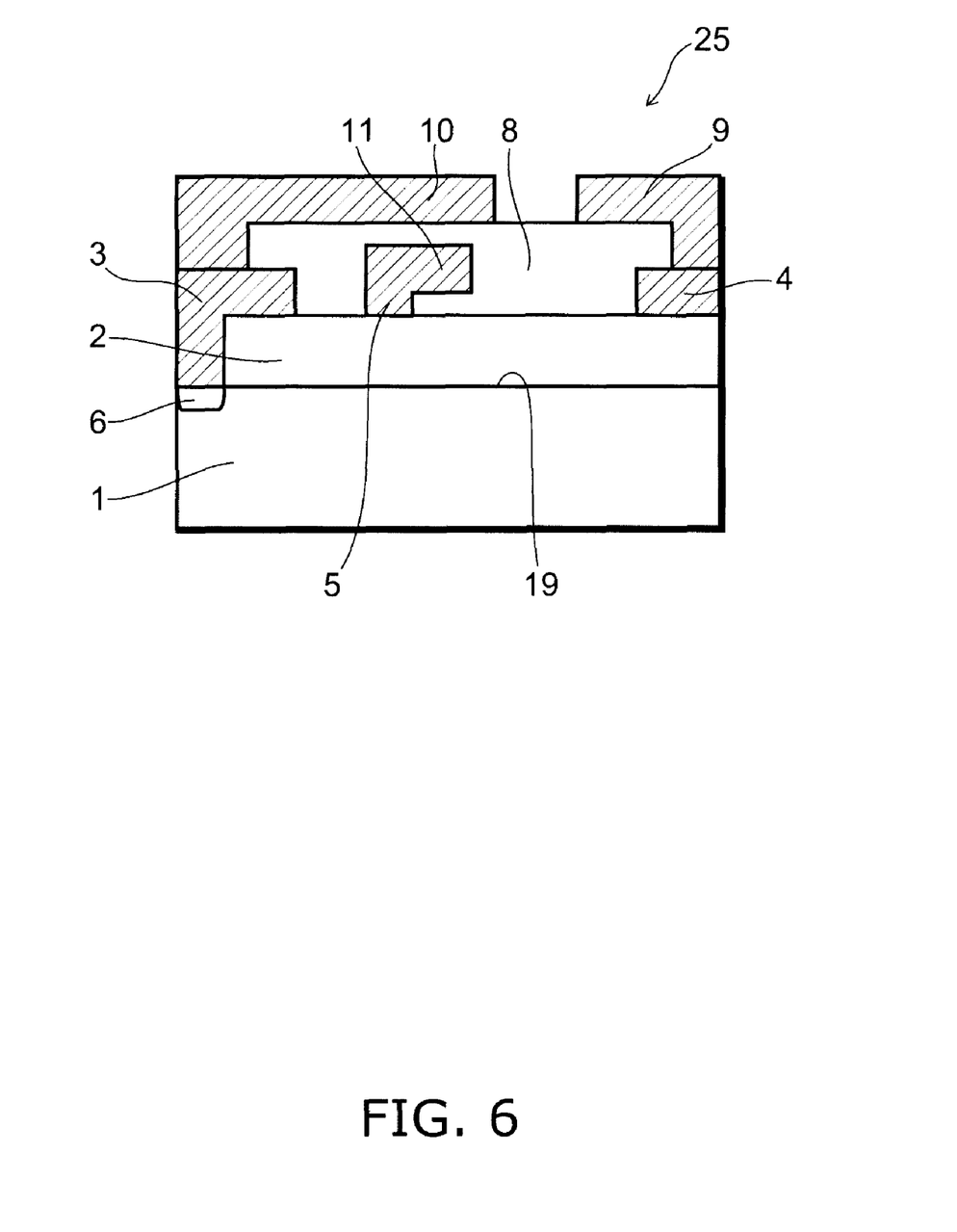
FIG. 6 is a cross-sectional view schematically illustrating a GaN-HFET according to a second variation of the second embodiment.

FIG. 6 is a cross-sectional view schematically illustrating a GaN-HFET according to this variation.

As shown in FIG. 6, in the GaN-HFET 25 according to this variation, in addition to the configuration of the GaN-HFET 24 (see FIG. 5) according to the first variation, a third field plate electrode 11 connected to the gate electrode 5 is provided in the field insulating film 8. The field plate electrode 11 extends out from the directly overlying region of the gate electrode 5 toward the drain electrode 4. Thus the electric field concentration on the edge of the gate electrode 5 can be alleviated more effectively. The configuration, operation, and effect in this variation other than the foregoing are the same as those in the first variation of the second embodiment described above.

Third Embodiment

Figure 7:
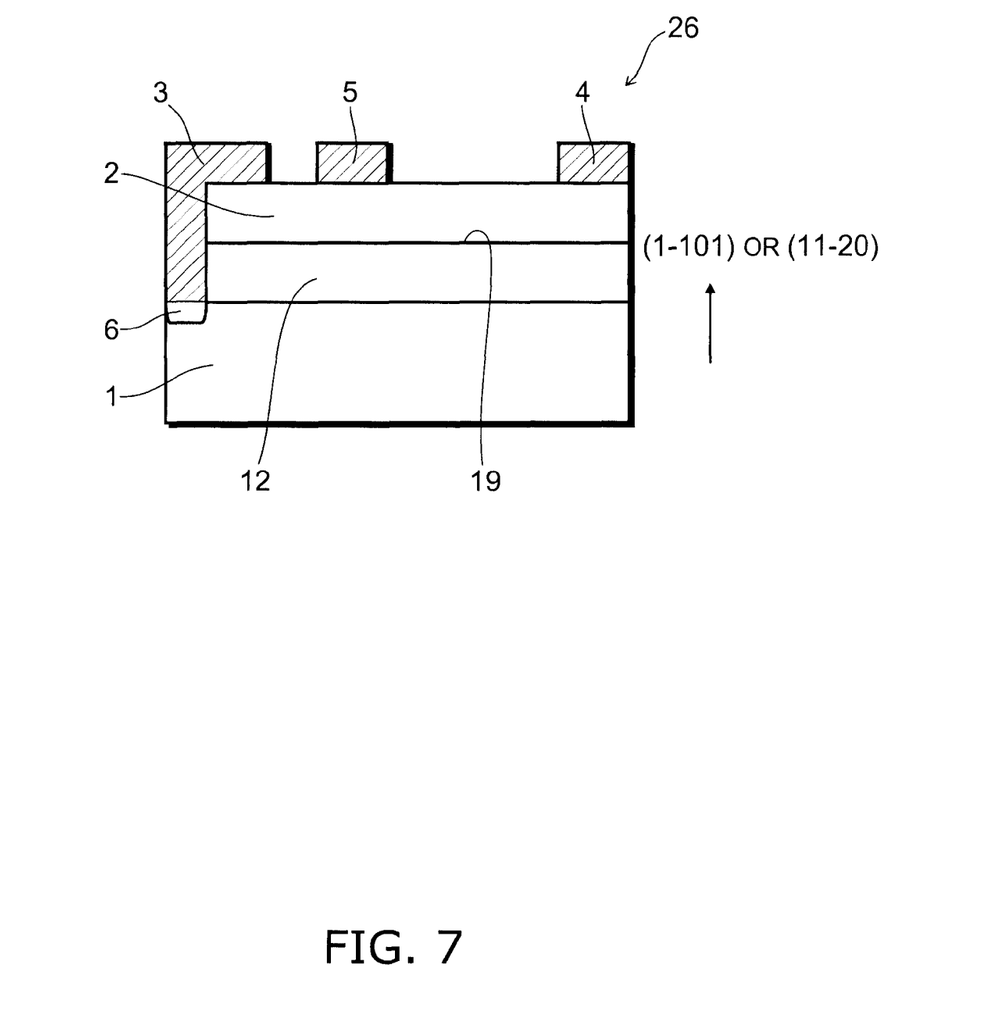
FIG. 7 is a cross-sectional view schematically illustrating a GaN-HFET according to a third embodiment of the invention.

FIG. 7 is a cross-sectional view schematically illustrating a GaN-HFET according to a third embodiment of the invention. In FIG. 7, the same elements as those in FIG. 1 are marked with like reference numerals, the detailed description thereof being omitted, and only different elements are described here in detail.

As shown in FIG. 7, in the GaN-HFET 26 according to this embodiment, in addition to the configuration of the GaN-HFET 21 (see FIG. 1) according to the first embodiment described above, an undoped GaN layer 12 is formed between the p-GaN channel layer 1 and the n-AlGaN barrier layer 2. The composition of the undoped GaN layer 12 can be expressed as $Al_xGa_{1-x}N$ ($0 \leq x < 1$). The undoped GaN layer 12 is epitaxially grown on the p-GaN channel layer 1 and not doped with impurities, and its crystal growth plane is the (1-101) or (11-20) plane. Hence both the interface between the p-GaN channel layer 1 and the undoped GaN layer 12 and the heterointerface between the undoped GaN layer 12 and the n-AlGaN barrier layer 2 have a surface orientation of (1-101) or (11-20). Preferably, the undoped GaN layer 12 has a thickness of approximately 0.5 to 1 μm, for example.

According to this embodiment, by forming an undoped GaN layer 12, a 2DEG serving as a channel is generated near the heterointerface 19 of the undoped GaN layer 12 with the n-AlGaN barrier layer 2. Thus the migration region of the 2DEG is located in the undoped GaN layer 12. This serves to prevent impurity scattering and to improve channel mobility, decreasing ON resistance. Furthermore, the potential of the heterointerface 19 can be lowered. Hence the 2DEG is less likely to be depleted, and the ON resistance can be further decreased.

Moreover, by forming an undoped GaN layer 12, acceptor ions in the p-GaN channel layer 1 can be prevented from penetrating into the n-AlGaN barrier layer 2. That is, separation between the p-layer and the n-layer is facilitated. Thus the variation of 2DEG sheet concentration due to dopant penetration can be prevented. In particular, dopant diffusion can be prevented more reliably by setting the thickness of the undoped GaN layer 12 to approximately 0.5 to 1 μm. The configuration, operation, and effect in this embodiment other than the foregoing are the same as those in the first embodiment described above.

It is noted that the p-GaN channel layer 1 can be formed from p-type AlGaN to widen the bandgap of the p-GaN channel layer 1, to strengthen carrier confinement in the undoped GaN layer 12, and to reduce channel leak current. Thus high breakdown voltage can be achieved more easily. Alternatively, the undoped GaN layer 12 can be formed from undoped InGaN to achieve the same effect. The composition combination of [p-GaN channel layer 1/undoped GaN layer 12] is not limited to the above simple combinations such as AlGaN/GaN and GaN/InGaN, but may be any combination as long as the bandgap of the undoped GaN layer 12 serving as a channel is narrower than the bandgap of the p-GaN channel layer 1.

Fourth Embodiment

Figure 8:
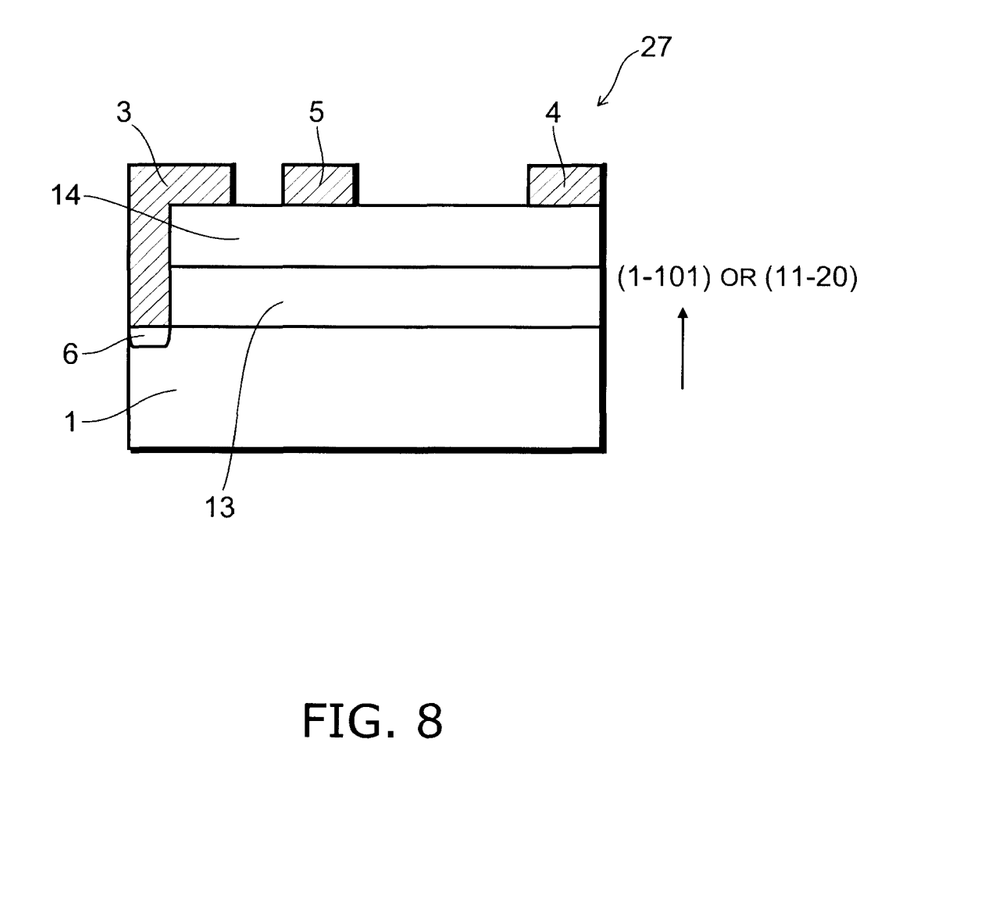
FIG. 8 is a cross-sectional view schematically illustrating a GaN-HFET according to a fourth embodiment of the invention.

FIG. 8 is a cross-sectional view schematically illustrating a GaN-HFET according to a fourth embodiment of the invention. In FIG. 8, the same elements as those in FIG. 1 are marked with like reference numerals, the detailed description thereof being omitted, and only different elements are described here in detail.

As shown in FIG. 8, in the GaN-HFET 27 according to this embodiment, an n-GaN layer 13 is formed as a third semiconductor layer on the p-GaN channel layer 1, and an undoped AlGaN barrier layer 14 is formed as a fourth semiconductor layer on the n-GaN layer 13. The p-GaN channel layer 1, the n-GaN layer 13, and the undoped AlGaN barrier layer 14 are formed by epitaxial growth with the crystal growth plane being the (1-101) or (11-20) plane. Hence the surface orientation of each interface between the layers is also the (1-101) or (11-20) plane.

As in the first embodiment described above, the p-GaN channel layer 1 is made of GaN or AlGaN doped with p-type impurities, and its composition can be expressed as $Al_xGa_{1-x}N$ where $0 \leq x < 1$. The n-GaN layer 13 is made of GaN or AlGaN doped with n-type impurities, and its composition can be expressed as $Al_zGa_{1-z}N$ where $0 \leq z < 1$ and $z \leq x$. That is, the p-GaN channel layer 1 has the same composition as the n-GaN layer 13 except for impurities, or the composition of the n-GaN layer 13 has a lower Al content than that of the p-GaN channel layer 1. Furthermore, the undoped AlGaN barrier layer 14 is made of undoped AlGaN, and its composition can be expressed as $Al_yGa_{1-y}N$ where $0 < y < 1$ and $z < y$. The sheet impurity concentration in the p-GaN channel layer 1 is e.g. 1 to 2 times the sheet impurity concentration in the n-GaN layer 13.

A source electrode 3, a drain electrode 4, and a gate electrode 5 are formed on the undoped AlGaN barrier layer 14. Part of the source electrode 3 penetrates the undoped AlGaN barrier layer 14 and the n-GaN layer 13 and is connected to a $p^+$-contact layer 6 formed locally in the surface of the p-GaN channel layer 1. Thus the source electrode 3 is connected to the p-GaN channel layer 1, the n-GaN layer 13, and the undoped AlGaN barrier layer 14.

In this embodiment, a 2DEG is generated at the heterointerface between the n-GaN layer 13 and the undoped AlGaN layer 14. The sheet concentration of this 2DEG is determined by the sheet impurity concentration in the n-GaN layer 13. By setting the sheet impurity concentration in the p-GaN channel layer 1 to be higher than the sheet impurity concentration in the n-GaN layer 13, the breakdown voltage is determined by avalanche breakdown on the drain electrode 4 side, and a stable breakdown voltage can be obtained. On the other hand, if the sheet impurity concentration in the p-GaN channel layer 1 is too high, the electric field excessively increases at the edge of the drain electrode 4, contrarily decreasing the breakdown voltage. The electric field distribution between the gate electrode 5 and the drain electrode 4 is determined by the difference between the sheet concentration in the n-GaN layer 13 and the sheet concentration in the p-GaN channel layer 1. If the sheet impurity concentration in the p-GaN channel layer 1 is higher than twice the sheet impurity concentration in the n-GaN layer 13, the breakdown voltage is lower than that in the case without interposition of the p-GaN channel layer 1. Therefore the sheet impurity concentration in the p-GaN channel layer 1 is preferably 1 to 2 times the sheet concentration in the n-GaN layer 13. The configuration, operation, and effect in this embodiment other than the foregoing are the same as those in the first embodiment described above.

In this embodiment, an undoped AlGaN layer 14 is illustratively provided on the n-GaN layer 13. However, it is also practicable that this AlGaN layer 14 is doped n-type. In this case, if the sheet impurity concentration in the p-GaN channel layer 1 is made higher than the sum of the sheet impurity concentration in the n-GaN layer 13 and the sheet impurity concentration in the AlGaN layer 14, the device breakdown voltage is determined by avalanche breakdown on the drain electrode 4 side, and a stable breakdown voltage can be obtained.

It is noted that, as in the third embodiment described above, the p-GaN channel layer 1 can be formed from p-type AlGaN to widen the bandgap of the p-GaN channel layer 1 and to strengthen carrier confinement in the n-GaN layer 13. This facilitates reducing channel leak current and improving the breakdown voltage. Alternatively, the n-GaN layer 13 can be formed from n-type InGaN to achieve the same effect. The composition combination of [p-GaN channel layer 1/n-GaN layer 13] is not limited to the above simple combinations such as AlGaN/GaN and GaN/InGaN, but may be any combination as long as the bandgap of the n-GaN layer 13 serving as a channel is narrower than the bandgap of the p-GaN channel layer 1. For example, also in the case where both the p-GaN channel layer 1 and the n-GaN layer 13 are formed from AlGaN, the same effect can be achieved by setting the Al content in the n-GaN layer 13 to be lower than the Al content in the p-GaN channel layer 1, i.e., $z \leq x$.

Next, a first variation of the fourth embodiment is described.

Figure 9:
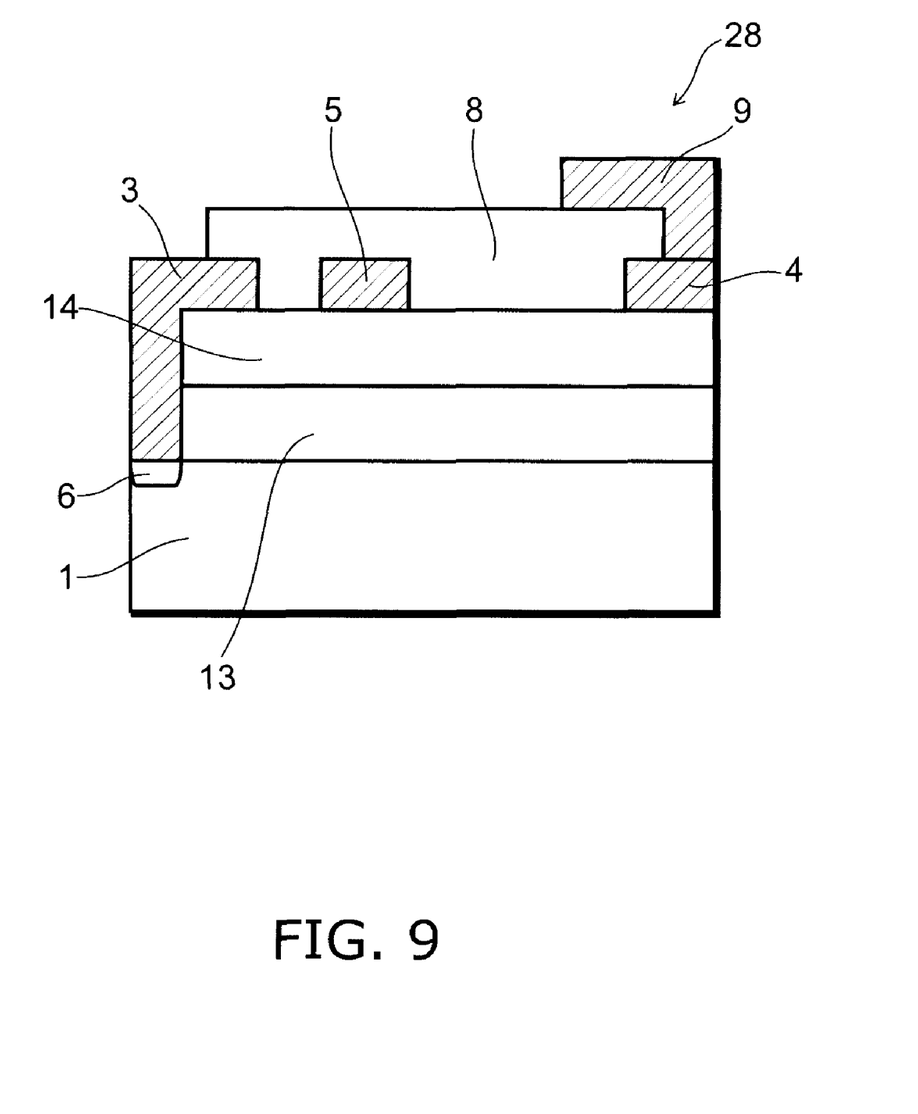
FIG. 9 is a cross-sectional view schematically illustrating a GaN-HFET according to a first variation of the fourth embodiment.

FIG. 9 is a cross-sectional view schematically illustrating a GaN-HFET according to this variation.

As shown in FIG. 9, in the GaN-HFET 28 according to this variation, in addition to the configuration of the GaN-HFET 27 (see FIG. 8) according to the fourth embodiment described above, a field insulating film 8 and a field plate electrode 9 are provided. The field insulating film 8 covers the surface of the undoped AlGaN layer 14 and the source electrode 3, the drain electrode 4, and the gate electrode 5. The field plate electrode 9 is connected to the drain electrode 4 and overhangs the field insulating film 8 from the directly overlying region of the drain electrode 4 toward the directly overlying region of the gate electrode 5. According to this variation, the field plate electrode 9 serves to prevent electric field concentration on the edge of the drain electrode 4, achieving high breakdown voltage. The configuration, operation, and effect in this variation other than the foregoing are the same as those in the fourth embodiment described above.

Next, a second variation of the fourth embodiment is described.

Figure 10:
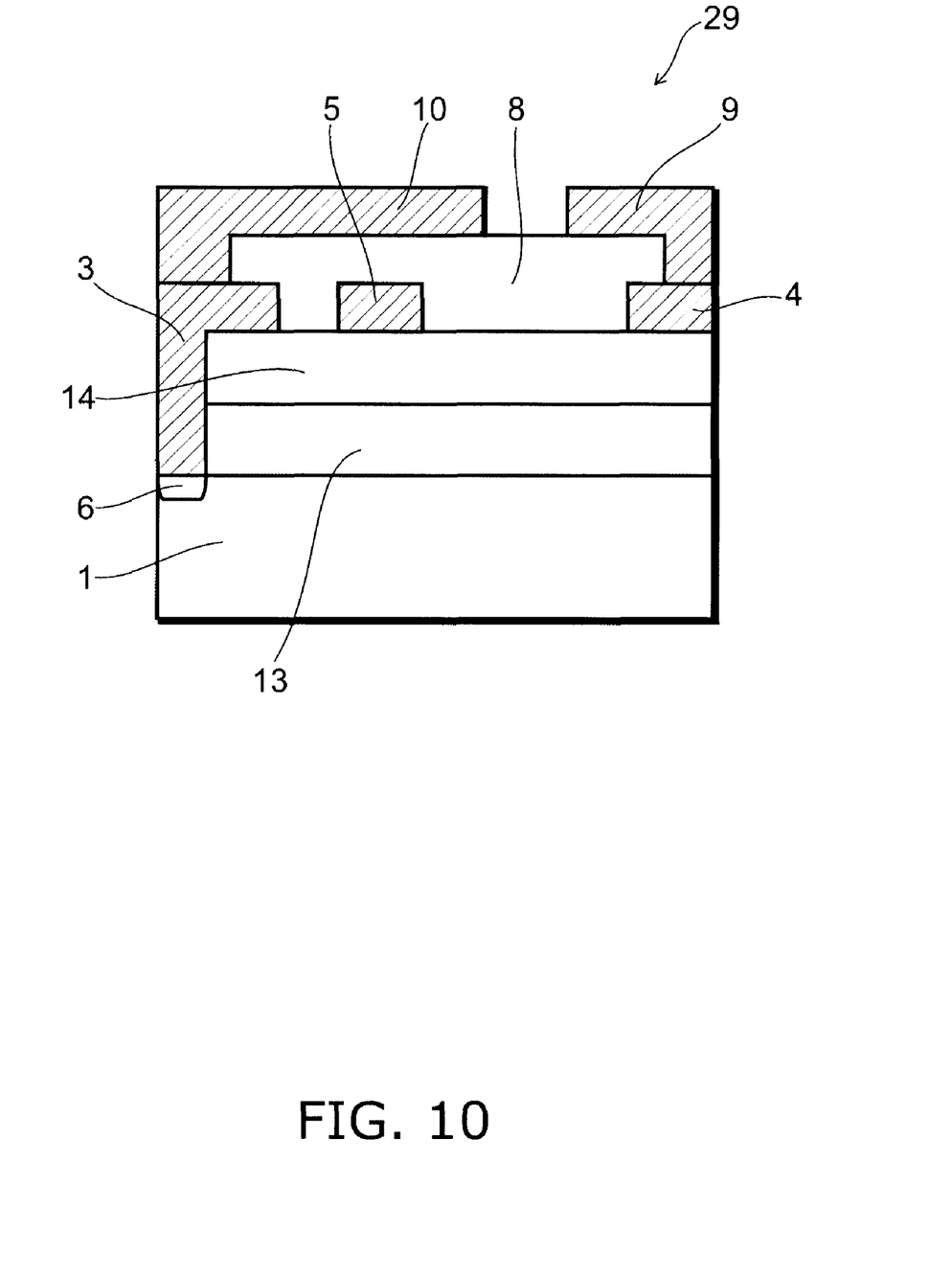
FIG. 10 is a cross-sectional view schematically illustrating a GaN-HFET according to a second variation of the fourth embodiment.

FIG. 10 is a cross-sectional view schematically illustrating a GaN-HFET according to this variation.

As shown in FIG. 10, in the GaN-HFET 29 according to this variation, in addition to the configuration of the GaN-HFET 28 (see FIG. 9) according to the first variation, a second field plate electrode 10 connected to the source electrode 3 is provided on the field insulating film 8. The field plate electrode 10 extends out from the directly overlying region of the source electrode 3 so as to cover the directly overlying region of the gate electrode 5.

According to this variation, the second field plate electrode 10 serves to prevent electric field concentration on the edge of the gate electrode 5 more effectively, achieving a higher breakdown voltage. It is noted that the second field plate electrode 10 may be connected to the gate electrode 5. The configuration, operation, and effect in this variation other than the foregoing are the same as those in the first variation of the fourth embodiment.

Next, a third variation of the fourth embodiment is described.

Figure 11:
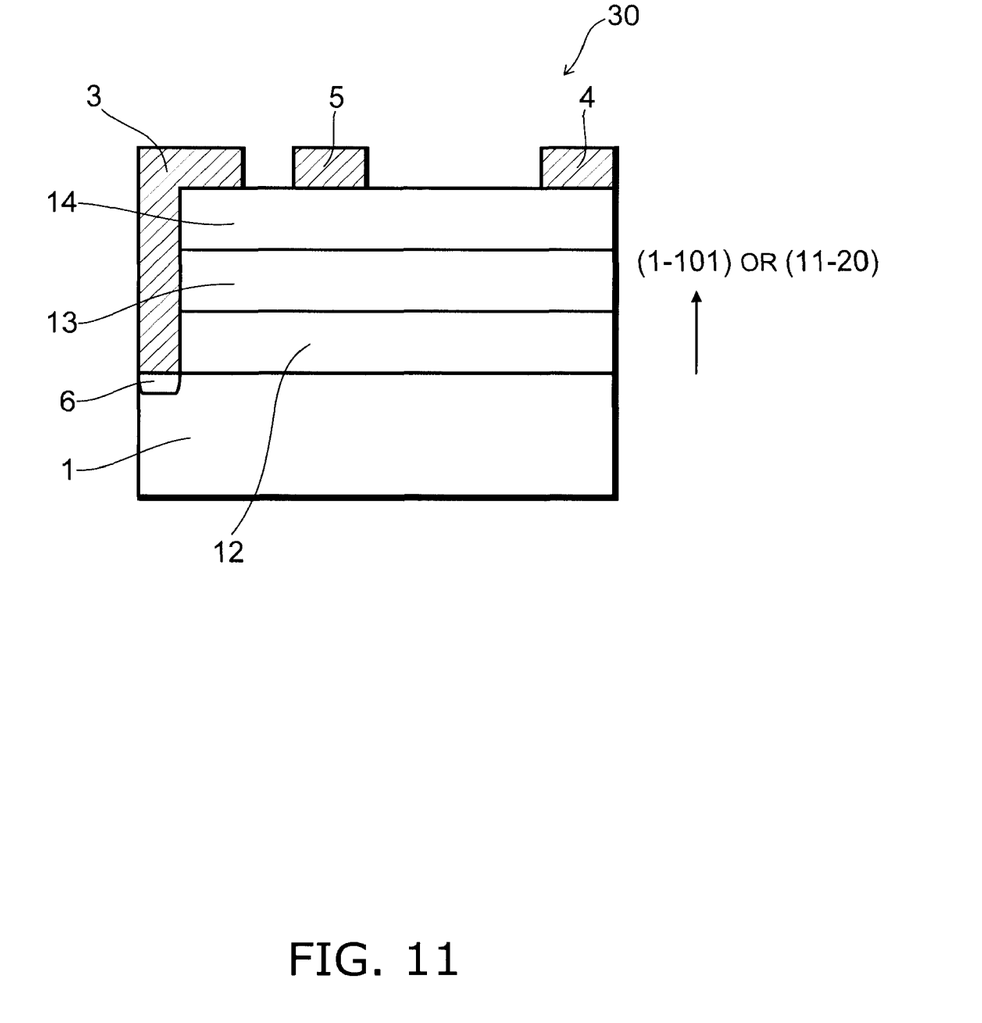
FIG. 11 is a cross-sectional view schematically illustrating a GaN-HFET according to a third variation of the fourth embodiment.

FIG. 11 is a cross-sectional view schematically illustrating a GaN-HFET according to this variation.

As shown in FIG. 11, in the GaN-HFET 30 according to this variation, in addition to the configuration of the GaN-HFET 27 (see FIG. 8) according to the fourth embodiment described above, an undoped GaN layer 12 is formed between the p-GaN channel layer 1 and the n-GaN layer 13. More specifically, in the GaN-HFET 30, from the support substrate (not shown) side, the p-GaN channel layer 1, the undoped GaN layer 12, the n-GaN layer 13, and the undoped AlGaN layer 14 are laminated in this order, and a source electrode 3, a drain electrode 4, and a gate electrode 5 are provided thereon. The configuration of the undoped GaN layer 12 is the same as the configuration of the undoped GaN layer 12 in the third embodiment described above.

According to this variation, the undoped GaN layer 12 serves to prevent the decrease of effective sheet electron concentration in the n-GaN layer 13 due to penetration of dopants out of the p-GaN channel layer 1. The configuration, operation, and effect in this variation other than the foregoing are the same as those in the fourth embodiment.

The invention has been described with reference to the first to fourth embodiment and their variations. However, the invention is not limited to these embodiments and variations, but any other variations easily conceivable by those skilled in the art are encompassed within the scope of the invention. For example, the invention is not limited by the material of the support substrate used for forming the GaN layer and the AlGaN layer. It is possible to use a SiC substrate, sapphire substrate, Si substrate, or GaN substrate, for example.

In the above embodiments and variations, a buffer layer may be formed on the support substrate, and the p-GaN channel layer 1 may be formed on the buffer layer. In this case, the buffer layer is not particularly limited in material and structure, but can be formed from AlN or AlGaN, for example.

The structure of the gate-drain region of the HFET described in the above embodiments and variations is similar to the structure of a heterostructure Schottky barrier diode (HSBD). Hence the structure according to the invention can be applied to an HSBD to realize an HSBD with small leak current, low ON resistance, and high breakdown voltage.

In the above embodiments and variations, the gate portion of the device illustratively has a planar Schottky gate structure. However, the invention is not limited thereto, but also practicable with gate structures other than the planar Schottky gate structure, such as a recess gate structure and a structure having a GaN cap layer or a p-layer.

In the above embodiments and variations, the crystal growth plane and heterointerface of the layers illustratively have a surface orientation of (1-101) or (11-20). However, like these planes, other level surfaces free from polarization may also be used to form a device.

The invention claimed is:

1. A semiconductor device comprising:
   a first semiconductor layer of p-type $Al_xGa_{1-x}N$ ($0 \leq x < 1$);
   a second semiconductor layer of n-type $Al_yGa_{1-y}N$ ($0 < y < 1$, $x < y$) formed on the first semiconductor layer, the second semiconductor layer having lower sheet impurity concentration than the first semiconductor layer;
   a control electrode formed on the second semiconductor layer;
   a first main electrode connected to the first semiconductor layer and the second semiconductor layer; and
   a second main electrode connected to the second semiconductor layer,
   an interface between the first semiconductor layer and the second semiconductor layer having a surface orientation of (1-101) or (11-20).

2. The semiconductor device according to claim 1, wherein the sheet impurity concentration in the first semiconductor layer is lower than or equal to twice the sheet impurity concentration in the second semiconductor layer.

3. The semiconductor device according to claim 1, further comprising:
a field insulating film covering a surface of the second semiconductor layer; and
a first field plate electrode provided on the field insulating film and connected to the second main electrode.

4. The semiconductor device according to claim 3, further comprising a second field plate electrode provided on the field insulating film and connected to the first main electrode.

5. The semiconductor device according to claim 4, further comprising a third field plate electrode provided on the field insulating film and connected to the control electrode.

6. The semiconductor device according to claim 1, further comprising a fifth semiconductor layer of undoped $Al_xGa_{1-x}N$ ($0 \leq x < 1$) provided between the first semiconductor layer and the second semiconductor layer, and having a crystal growth plane of (1-101) or (11-20) plane.

7. The semiconductor device according to claim 6, wherein a thickness of the fifth semiconductor layer is from 0.5 μm to 1 μm.

8. The semiconductor device according to claim 1, further comprising a fifth semiconductor layer of undoped InGaN provided between the first semiconductor layer and the second semiconductor layer, and having a crystal growth plane of (1-101) or (11-20) plane.

9. The semiconductor device according to claim 1, further comprising a gate insulating film provided between the second semiconductor layer and the control electrode.

10. A semiconductor device comprising:
a first semiconductor layer of p-type $Al_xGa_{1-x}N$ ($0 \leq x < 1$);
a third semiconductor layer of n-type $Al_zGa_{1-z}N$ ($0 \leq z < 1$, $z \leq x$) formed on the first semiconductor layer;
a fourth semiconductor layer of n-type or undoped $Al_yGa_{1-y}N$ ($0 < y < 1$, $z < y$) formed on the third semiconductor layer;
a control electrode formed on the fourth semiconductor layer;
a first main electrode connected to the first semiconductor layer, the third semiconductor layer, and the fourth semiconductor layer; and
a second main electrode connected to the fourth semiconductor layer,
an interface between the third semiconductor layer and the fourth semiconductor layer having a surface orientation of (1-101) or (11-20), wherein a sheet impurity concentration in the first semiconductor layer is higher than a sum of a sheet impurity concentration in the third semiconductor layer and a sheet impurity concentration in the fourth semiconductor layer.

11. The semiconductor device according to claim 10, wherein the sheet impurity concentration in the first semiconductor layer is equal to or lower than twice the sum of the sheet impurity concentration in the third semiconductor layer and the sheet impurity concentration in the fourth semiconductor layer.

12. The semiconductor device according to claim 10, further comprising:
a field insulating film covering a surface of the fourth semiconductor layer; and
a first field plate electrode provided on the field insulating film and connected to the second main electrode.

13. The semiconductor device according to claim 12, further comprising a second field plate electrode provided on the field insulating film and connected to the first main electrode or the control electrode.

14. The semiconductor device according to claim 10, further comprising a fifth semiconductor layer of undoped $Al_xGa_{1-x}N$ ($0 \leq x < 1$) provided between the first semiconductor layer and the third semiconductor layer, and having a crystal growth plane of (1-101) or (11-20) plane.

15. A semiconductor device comprising:
a first semiconductor layer of p-type $Al_xGa_{1-x}N$ ($0 \leq x < 1$);
a third semiconductor layer of n-type InGaN formed on the first semiconductor layer;
a fourth semiconductor layer of n-type or undoped $Al_yGa_{1-y}N$ ($0 < y < 1$) formed on the third semiconductor layer;
a control electrode formed on the fourth semiconductor layer;
a first main electrode connected to the first semiconductor layer, the third semiconductor layer, and the fourth semiconductor layer; and
a second main electrode connected to the fourth semiconductor layer,
an interface between the third semiconductor layer and the fourth semiconductor layer having a surface orientation of (1-101) or (11-20), wherein a sheet impurity concentration in the first semiconductor layer is higher than a sum of a sheet impurity concentration in the third semiconductor layer and a sheet impurity concentration in the fourth semiconductor layer.

16. The semiconductor device according to claim 15, wherein the sheet impurity concentration in the first semiconductor layer is equal to or lower than twice the sum of the sheet impurity concentration in the third semiconductor layer and the sheet impurity concentration in the fourth semiconductor layer.

17. The semiconductor device according to claim 15, further comprising:
a field insulating film covering a surface of the fourth semiconductor layer; and
a field plate electrode provided on the field insulating film and connected to the second main electrode.

* * * * *